United States Patent [19]
Yu

[11] Patent Number: 5,953,615
[45] Date of Patent: Sep. 14, 1999

[54] PRE-AMORPHIZATION PROCESS FOR SOURCE/DRAIN JUNCTION

[75] Inventor: Bin Yu, Santa Clara, Calif.

[73] Assignee: Advance Micro Devices, Sunnyvale, Calif.

[21] Appl. No.: 09/238,359

[22] Filed: Jan. 27, 1999

[51] Int. Cl.$^6$ .................. H01L 21/266; H01L 21/336
[52] U.S. Cl. ................... 438/303; 438/528; 438/231
[58] Field of Search .................................. 438/231, 303, 438/528, FOR 188

[56] References Cited

U.S. PATENT DOCUMENTS 4,584,026   4/1986   Wu et al. .
5,266,510  11/1993   Lee .

FOREIGN PATENT DOCUMENTS 4-158528   6/1992   Japan .

Primary Examiner—George Fourson
Assistant Examiner—Joannie A Garcia
Attorney, Agent, or Firm—LaRiviere, Grubman & Payne, LLP

[57] ABSTRACT

The inventive method provides MOSFET's with deep source/drain junctions and shallow source/drain extensions. The invention provides on a semiconductor wafer a gate stack with side spacers. The side spacers are etched so that a known thickness of the side spacers is left. An ion beam is used to implant $Si^+$ or $Ge^+$ or $Xe^+$ to amorphize the silicon region, creating an amorphous region with two different depths. A high dose ion beam is then used to implant a dopant. An oxide layer is then deposited as a barrier layer, and then a metal layer is deposited to improve laser energy absorption. Laser annealing is used to melt the amorphous silicon region which causes the dopant to diffuse into the amorphous silicon region creating deep source/drain junctions and shallow source/drain extensions. Conventional techniques are then used to complete the transistor, which includes silicidation of the source/drain junctions. The deep source/drain junctions allow for an easier silicidation. The shallow source/drain extensions help to prevent punch through.

12 Claims, 2 Drawing Sheets

PRE-AMORPHIZATION PROCESS FOR SOURCE/DRAIN JUNCTION

FIELD OF THE INVENTION

The present invention relates to MOSFET devices. Even more particularly, the present invention relates to MOSFET devices with a deep source and a deep drain (deep source/drain junctions) and a shallow source extension and a shallow drain extension (shallow source/drain extensions).

BACKGROUND OF THE INVENTION

In the prior art, laser annealing is used in ultra-shallow junction for ULSI MOS transistors using a pre-amorphization implant (by $Si^+$ or $Ge^+$ or $Xe^+$) to create a shallow amorphous silicon (a-Si) layer under the surface of a substrate. The prior art then placed a gate and spacers over the shallow source/drain extensions and then used a separate process to create the deeper source and drain. The shallow source/drain extensions were desirable to prevent punch through. The deeper source/drains were desirable to allow silicidation. The prior art required separate processes to produce shallow source/drain extensions and deep source/drain junctions.

It would be advantageous to create a deeper source and drain and shallower source/drain extensions in a single process.

BRIEF SUMMARY OF THE INVENTION

It is an object of the invention to provide method of creating a deep source/drain and shallow source/drain extensions with a single laser annealing process and a single implantation process.

Accordingly, the foregoing object is accomplished by providing on a semiconductor wafer a gate stack with side spacers. The side spacers are etched so that a known thickness of the side spacers is left. An ion beam is used to implant $Si^+$ or $Ge^+$ or $Xe^+$ to amorphize the silicon region, creating an amorphous region with two different depths. A high dose ion beam is then used to implant a dopant. An oxide layer is then deposited as a barrier layer, and then a metal layer is deposited to improve laser energy absorption. Laser annealing is used to melt the amorphous silicon region which causes the dopant to diffuse into the amorphous silicon region creating deep source/drain junctions and shallow source/drain extensions. Conventional techniques are then used to complete the transistor fabrication.

Other features of the present invention are disclosed or apparent in the section entitled: "DETAILED DESCRIPTION OF THE INVENTION."

BRIEF DESCRIPTION OF DRAWINGS

For a fuller understanding of the present invention, reference is made to the accompanying drawings wherein.

Figure 1:
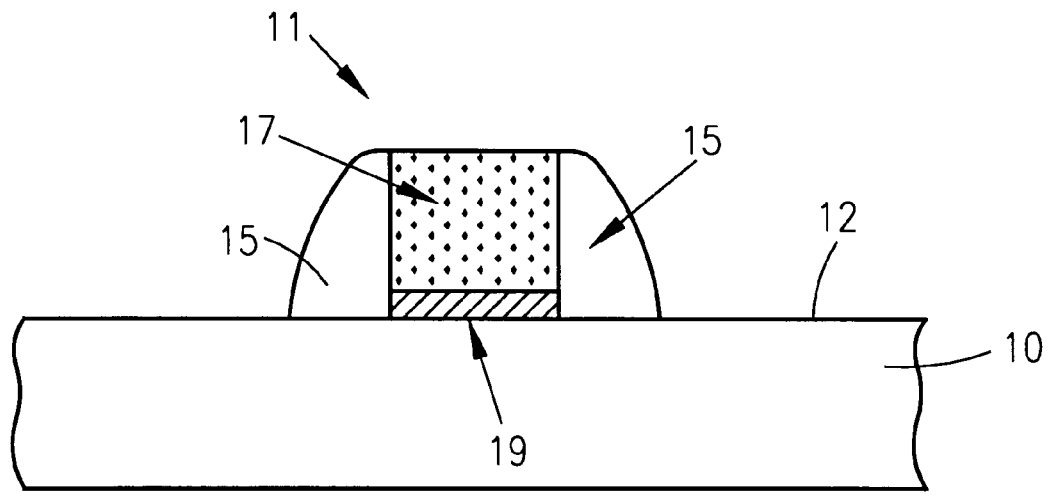
FIG. 1 is a cross sectional view of part of a silicon wafer and the first phase of a MOSFET on the silicon chip.

Reference numbers refer to the same or equivalent parts of the present invention throughout the several figures of the drawing.

DETAILED DESCRIPTION OF THE INVENTION AND BEST MODE OF THE INVENTION

FIG. 1 is a cross sectional view of part of a silicon wafer 10 and the first phase of a MOSFET 11 on the silicon wafer 10. The surface of the silicon wafer 10 forms a substrate 12 for the MOSFET 11. The first phase of the MOSFET 11 has a gate 17 placed on a gate oxide 19 placed on the surface of the substrate 12. Plasma-enhanced chemical vapor deposition (PECVD) is used to deposit oxide spacers. A plasma dry etcher is used to etch back the oxide to form the oxide spacers 15 adjacent to the gate 17 as shown in FIG. 1. The manufacture of the first phase of the MOSFET is according to conventional means.

Figure 2:
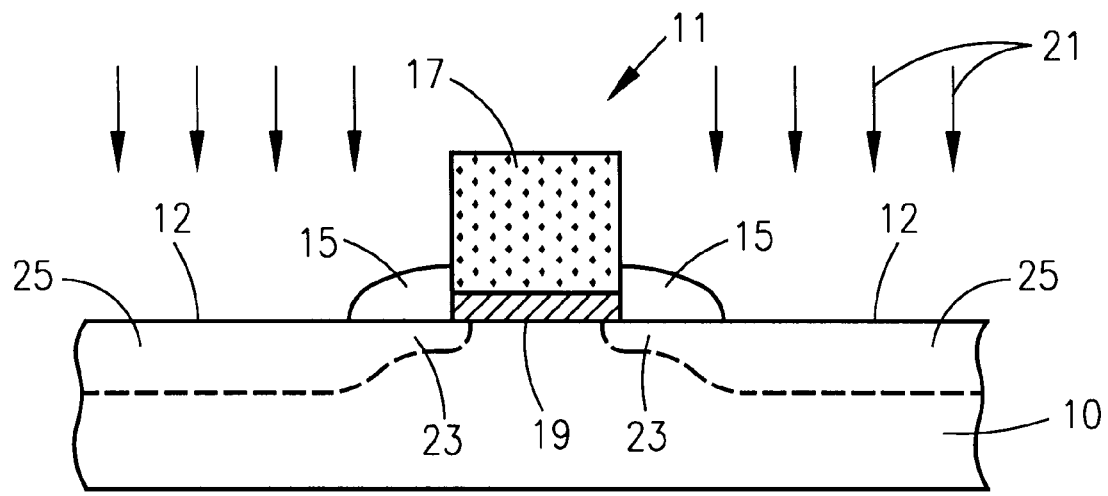
FIG. 2, is a cross sectional view of part of a silicon wafer with the MOSFET undergoing,/amorphization.

A well-controlled wet chemical etching (such as spray etching) is used to further etch the oxide spacers 15 so that only a known thickness of the oxide film is left at the corner of the gate 17, gate oxide 19 and substrate 12, as shown in FIG. 2. A first ion beam 21 provides a stream of either $Si^+$ or $Ge^+$ or $Xe^+$ ions, which creates shallow amorphous silicon regions 23 under the etched oxide spacers 15 and deep amorphous silicon regions 25 away from the etched oxide spacers 15. The oxide spacers 15 are thin enough to allow some of the ions from the first ion beam 21 pass through to the substrate 12, but are thick enough to absorb some of the energy from the ions in the first ion beam 21. The ions passing through the oxide spacers are slowed, so that they create the shallow amorphous regions 23 below the spacers 15. Ions that do not pass into the oxide spacers 15 and the gate oxide 19 are not slowed down or stopped and therefore create the deep amorphous regions 25.

Figure 3:
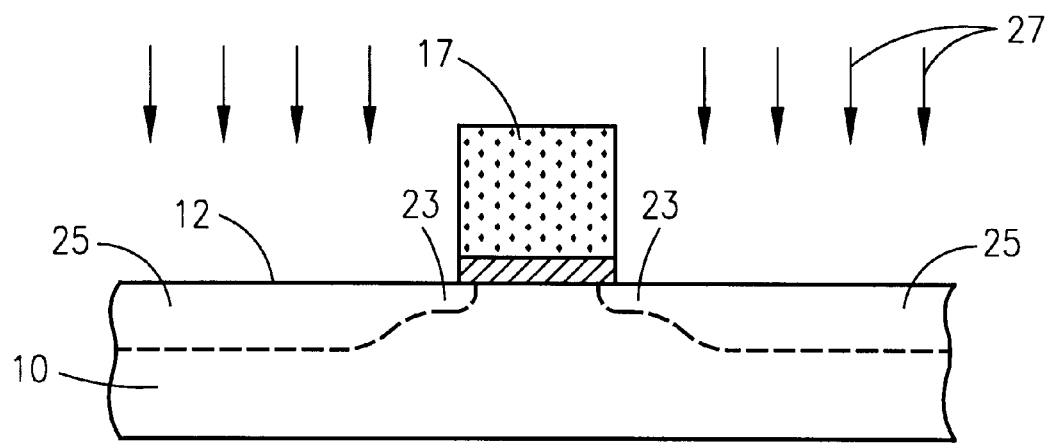
FIG. 3 is a cross sectional view of part of a silicon wafer with the MOSFET undergoing dopant implantation.

The oxide spacer 15 is then etched away, using anisotropic plasma etching. A second ion beam 27 is used to implant a high dose dopant into the shallow and deep amorphous silicon regions 23, 25, as shown in FIG. 3. For an n-channel MOSFET, arsenic or phosphorous is used as the dopant. For a p-channel MOSFET, boron or boron trifluoride is used as the dopant.

Figure 4:
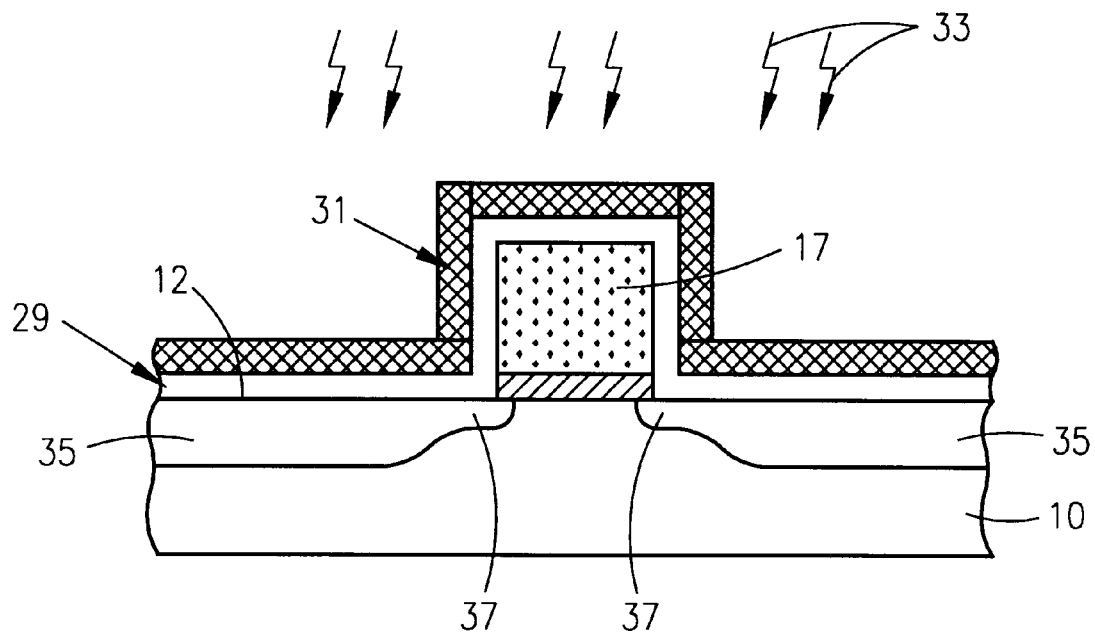
FIG. 4 is a cross sectional view of part of a silicon wafer with the MOSFET undergoing laser annealing.

Plasma-enhanced chemical vapor deposition (PECVD) is used to deposit an oxide film barrier layer 29 over the surface of the silicon wafer 10 and the gate oxide 19, as shown in FIG. 4. A metal layer 31, of such metals as titanium, titanium nitride, and tantalum, is sputtered over the oxide film barrier layer 29 to improve laser energy absorption. An excimer laser beam 33 is used to provide ultra-rapid annealing. The deep and shallow amorphous silicon regions 23, 25 are melted by the laser annealing causing the dopant to diffuse throughout the deep and shallow amorphous silicon regions 23, 25. The deep amorphous regions 25 become source/drain regions 35. The shallow amorphous regions 23 become source/drain extensions 37. The laser annealing causes complete activation of the dopant causing high conductivity in both the source/drain regions 35 and the source/drain extensions 37.

The metal layer 31 and the oxide film barrier layer 29 are removed, and the conventional MOSFET processing is done to form a transistor, including the silicidation of the source/drain junctions. Because the source/drain junctions are deep, they can be more easily silicidated.

In the specification and claims the terms deep amorphous regions and shallow amorphous regions are relative terms, mainly meaning that the deep amorphous regions are significantly deeper than the shallow amorphous regions due to the use of the spacers to slow ions from the ion beam for amorphization. Preferably the deep amorphous regions are more than twice as deep as the shallow amorphous regions.

More preferably, the deep amorphous regions are between 3 to 4 times as deep as the shallow amorphous regions. An example of depths in the preferred embodiment, shallow amorphous regions may be from 20–40 nm in depth and deep amorphous regions may be from 60–160 nm in depth.

The present invention has been particularly shown and described with respect to certain preferred embodiments and features thereof. However, it should be readily apparent to those of ordinary skill in the art that various changes and modifications in form and detail may be made without departing from the spirit and scope of the inventions as set forth in the appended claims. The inventions illustratively disclosed herein may be practiced without any element which is not specifically disclosed herein.

We claim:

1. A method of producing a plurality of semiconductor devices on a semiconductor wafer, comprising the steps of:

placing a plurality of gates on the semiconductor wafer;

forming a plurality of spacers on the sides of the gates;

etching the plurality of spacers, wherein the plurality of spacers are etched to a known thickness;

amorphizing part of the semiconductor wafer, forming a plurality of shallow amorphous regions in areas of the semiconductor wafer under the plurality of spacers and a plurality of deep amorphous regions in areas of the semiconductor wafer that are not under the plurality of spacers or the plurality of gates implanting a dopant into the plurality of shallow amorphous regions and the plurality of deep amorphous regions; and annealing the plurality of shallow amorphous regions and the plurality of deep amorphous regions.

2. The method, as recited in claim 1, wherein the step of amorphizing, comprises the steps of:

directing a plurality of ions from an ion beam for amorphization towards the semiconductor wafer;

passing a first part of the plurality of ions through the plurality of spacer so that the energy of the first part of the plurality of ions is reduced as the first part of the plural of ions pass through the spacers;

passing the first part of the plurality of ions into the areas of the semiconductor wafer under the plurality of spacer forming the shallow amorphous regions, due to the reduced energy of the first part of the plurality of ions; and passing a second part of the plurality of ions into areas of the semiconductor wafer not covered by the plurality of spacers and plurality of gates, thus forming deep amorphous regions.

3. The method, as recited in claim 2, wherein the step of etching comprises the step of using a well-controlled wet chemical etching.

4. The method, as recited in claim 3, further comprising the step of etching away the plurality of spacers after the step of amorphizing part of the semiconductor wafer.

5. The method, as recited in claim 4, wherein the step of annealing comprises the steps of:

depositing an oxide film over the semiconductor wafer including the plurality of shallow amorphous regions and the plurality of deep amorphous regions;

depositing a metal layer over the oxide film;

heating the metal layer with a laser beam; and removing the metal layer and the oxide film.

6. The method, as recited in claim 5, wherein the step of implanting a dopant comprises the step of directing an ion beam of dopant ions towards the plurality of shallow amorphous regions and the plurality of deep amorphous regions.

7. The method, as recited in claim 6, wherein the plurality of ions from the ion beam for amorphization are ions selected from the group consisting of $Si_+$ and $Ge^+$ and $Xe^+$.

8. The method, as recited in claim 7, wherein the step of heating the metal layer with a laser beam comprises the step of directing an ultra-rapid excimer laser beam towards the metal layer.

9. The method, as recited in claim 8, wherein the dopant ions are selected from the group consisting of ions of arsenic, phosphorous, boron trifluoride and boron.

10. The method, as recited in 9, wherein the step of annealing the plurality of shallow amorphous regions and the plurality of deep amorphous regions transforms the plurality of shallow amorphous regions into a plurality of shallow source/drain extensions and transforms the plurality of deep amorphous regions into a plurality of deep source/drain junctions, further comprising the step of silicidating the deep source/drain junctions.

11. The method, as recited in 4, wherein the step of annealing the plurality of shallow amorphous regions and the plurality of deep amorphous regions transforms the plurality of shallow amorphous regions into a plurality of shallow source/drain extensions and transforms the plurality of deep amorphous regions into a plurality of deep source/drain junctions, further comprising the step of silicidating the deep source/drain junctions.

12. The method, as recited in 1, wherein the step of annealing the plurality of shallow amorphous regions and the plurality of deep amorphous regions transforms the plurality of shallow amorphous regions into a plurality of shallow source/drain extensions and transforms the plurality of deep amorphous regions into a plurality of deep source/drain junctions, further comprising the step of silicidating the deep source/drain junctions.

* * * * *

UNITED STATES PATENT AND TRADEMARK OFFICE
CERTIFICATE OF CORRECTION

PATENT NO. : 5,953,615
DATED : September 14, 1999
INVENTOR(S) : Bin Yu

Page 1 of 1

It is certified that error appears in the above-identified patent and that said Letters Patent is hereby corrected as shown below:

Assignee, Item [73],
Please delete [Advance] and replace with -- Advanced --.

Signed and Sealed this

Twenty-eighth Day of August, 2001

*Attest:*

*Attesting Officer*

NICHOLAS P. GODICI
*Acting Director of the United States Patent and Trademark Office*